(12) United States Patent
Kato et al.

(10) Patent No.: US 8,043,723 B2
(45) Date of Patent: Oct. 25, 2011

(54) ORGANIC EL DEVICE WITH ORGANIC LAYER INCLUDING STARBURST COMPOUND

(75) Inventors: Tetsuya Kato, Anjo (JP); Kazushige Kojima, Aichi-gun (JP)

(73) Assignee: Denso Corporation, Kariya, Aichi Pref. (JP)

( * ) Notice: Subject to any disclaimer, the term of this patent is extended or adjusted under 35 U.S.C. 154(b) by 878 days.

(21) Appl. No.: 11/653,853

(22) Filed: Jan. 17, 2007

(65) Prior Publication Data

US 2007/0224449 A1   Sep. 27, 2007

(30) Foreign Application Priority Data

Mar. 27, 2006 (JP) ................................ 2006-085214

(51) Int. Cl.
*H01L 51/54* (2006.01)

(52) U.S. Cl. ........ 428/690; 428/917; 313/504; 313/506; 257/40; 257/E51.051

(58) Field of Classification Search .................. None
See application file for complete search history.

(56) References Cited

U.S. PATENT DOCUMENTS

| | | | |
|---|---|---|---|
| 5,792,557 A | 8/1998 | Nakaya et al. | |
| 7,374,830 B2 * | 5/2008 | Kato et al. | 428/690 |
| 2004/0058193 A1 * | 3/2004 | Hatwar | 428/690 |
| 2005/0184657 A1 | 8/2005 | Kato et al. | |
| 2009/0058287 A1 * | 3/2009 | Akashi et al. | 313/504 |

FOREIGN PATENT DOCUMENTS

| JP | 2005-276802 | 10/2005 |
|---|---|---|
| JP | 2007-246399 | 9/2007 |

OTHER PUBLICATIONS

Taiwan Official Action issued for corresponding Taiwan patent application No. 96102693, dated Jul. 20, 2010 (with translation).
Japanese Examination Report issued for Japanese Patent Application No. 2006-085214, mailed Mar. 8, 2011.

* cited by examiner

*Primary Examiner* — Dawn L Garrett
*Assistant Examiner* — Andrew K Bohaty
(74) *Attorney, Agent, or Firm* — Nixon & Vanderhye P.C.

(57) ABSTRACT

An organic EL device includes: a pair of electrodes; and an organic layer sandwiched between the pair of electrodes. The organic layer includes a compound including layer, and the compound including layer includes a compound of 1,3-bis[N,N-bis{(4'-methylbiphen-4-yl)}amino]-5-N,N-bis(4-methylphenyl) aminobenzene. The heat resistance and the vapor deposition property of the organic layer containing the above tertiary amine compound can be improved.

5 Claims, 6 Drawing Sheets

| | DEPO. RATE THRESHOLD TEMP. | DECOMPOSITION THRESHOLD TEMP. | DEPO. PROPERTY |
|---|---|---|---|
| COMPOUND IVA | 340°C | 375°C | GOOD |
| COMPOUND IVB | 405°C | 360°C | POOR |
| COMPOUND IVC | 415°C | 375°C | POOR |
| COMPOUND III | 360°C | 375°C | GOOD |

FIG. 9

| EXAMPLE | HOLE TRANSPORTING MATERIAL | ELECTRON TRANSPORTING MATERIAL | DOPANT LIGHT EMITTING MATERIAL | EMISSION DURATION (400 cd/m²) | EMISSION DURATION (800 cd/m²) | Tg (Tm) (°C) | ΔIp (eV) | DEPOSITION PROPERTY |
|---|---|---|---|---|---|---|---|---|
| 1-1 | COMPOUND IVA | COMPOUND VA | COMPOUND VC AND VD | 0.95 | POOR | 103 (278) | 0.35 | GOOD |
| 1-2 | COMPOUND IVA | COMPOUND VB | COMPOUND VC AND VD | 0.7 | POOR | 103 (278) | 0.25 | GOOD |
| 2-1 | COMPOUND IVB | COMPOUND VA | COMPOUND VC AND VD | 0.7 | 0.55 | (325) | 0.32 | POOR |
| 2-2 | COMPOUND IVB | COMPOUND VB | COMPOUND VC AND VD | 0.6 | 0.4 | (325) | 0.22 | POOR |
| 3-1 | COMPOUND IVC | COMPOUND VA | COMPOUND VC AND VD | 0.9 | 0.8 | (408) | 0.38 | POOR |
| 3-2 | COMPOUND IVC | COMPOUND VB | COMPOUND VC AND VD | 0.7 | 0.6 | (408) | 0.27 | POOR |
| 4-1 | COMPOUND III | COMPOUND VA | COMPOUND VC AND VD | 0.95 | 0.87 | 180 (325) | 0.43 | GOOD |
| 4-2 | COMPOUND III | COMPOUND VB | COMPOUND VC AND VD | 0.7 | 0.62 | 180 (325) | 0.33 | GOOD |

ORGANIC EL DEVICE WITH ORGANIC LAYER INCLUDING STARBURST COMPOUND

CROSS REFERENCE TO RELATED APPLICATION

This application is based on Japanese Patent Application No. 2006-85214 filed on Mar. 27, 2006, the disclosure of which is incorporated herein by reference.

FIELD OF THE INVENTION

The present invention relates to an organic EL device.

BACKGROUND OF THE INVENTION

Generally an organic EL device has an organic layer including a light emitting layer, composed of an organic substance, between a pair of electrodes. The light emitting layer is prepared by using an electron transporting material as a host and by adding a dopant light emitting material thereto.

In this case, the electron transporting material transports holes and electrons, so that the dopant light emitting material emits a light. In this process, also the electron transporting material used as the host can be excited to deteriorate the duration of light emission with a sufficient luminance (the emission duration).

Thus, methods of using a light emitting layer prepared by mixing a host of a hole transporting material and an electron transporting material with a dopant of a dopant light emitting material, i.e. a light emitting layer containing a mixed host, have been proposed as methods for improving the emission duration, which is disclosed in U.S. Pat. No. 5,792,557.

In this light emitting layer, the host is functionally separated such that the hole transporting material transports holes and the electron transporting material transports electrons, thereby increasing the emission duration.

When the hole transporting material in the mixed host has two or more oxidation potentials, the effective energy gap in the host between the hole transporting material and the electron transporting material is reduced, charge transfer is caused between these materials, and thereby the electron transporting material can be excited more easily.

In view of this problem, a method of using a mixed host containing a hole transporting material of a starburst tertiary amine compound having only one oxidation potential measured by a cyclic voltammetry method, thereby further improving the emission duration, has been proposed in US Patent Publication NO. 2005-184657.

However, as a result of research by the inventor, it has been found that the hole transporting material of the starburst tertiary amine compound results in insufficient film forming property (or vapor deposition property) and the material is insufficient in heat resistance from the viewpoint of further improving the high-temperature property of the organic EL device.

SUMMARY OF THE INVENTION

In view of the above-described problem, it is an object of the present disclosure to provide an organic EL device.

An organic EL device includes: a pair of electrodes; and an organic layer sandwiched between the pair of electrodes. The organic layer includes a compound including layer, and the compound including layer includes a compound of 1,3-bis[N, N-bis{(4'-methylbiphen-4-yl)}amino]-5-N,N-bis(4-methylphenyl)aminobenzene. The heat resistance and the vapor deposition property of the layer containing the above tertiary amine compound can be improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventor has experimentally produced starburst tertiary amine compounds used as a hole transporting material, and has researched the heat resistance and the vapor deposition property of the compound as shown in FIGS. 2 to 9.

Further, the inventor has designed and examined the molecular structure based on the results of the above research, and as a result the inventor has found a novel starburst tertiary amine compound with improved heat resistance and vapor deposition property. The invention has been accomplished based on the finding.

Figure 3:
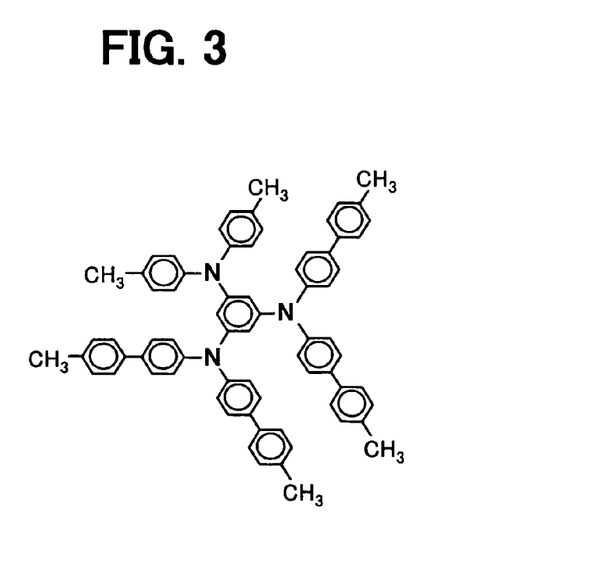
FIG. 3 is a schematic view showing a chemical structure of a compound III.
Figure 4A:
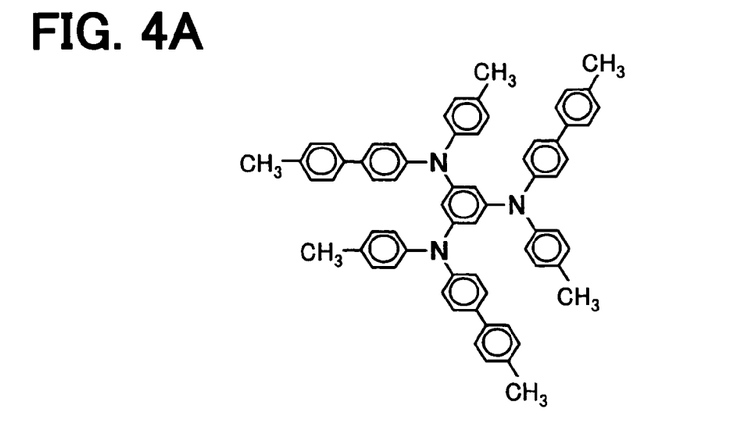
FIGS. 4A to 4C are schematic views showing chemical structures of compounds IVA to IVC, respectively.
Figure 4B:
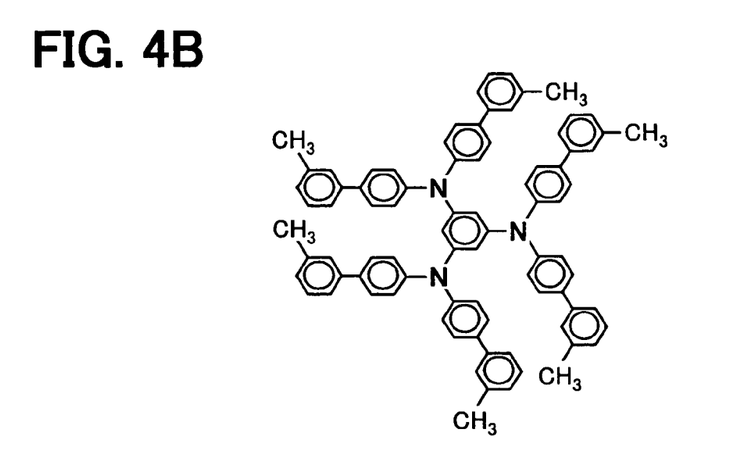
Figure 4C:
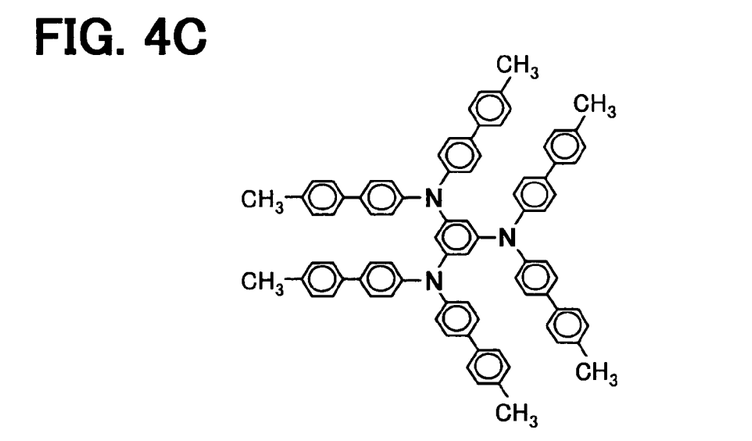
Figure 5A:
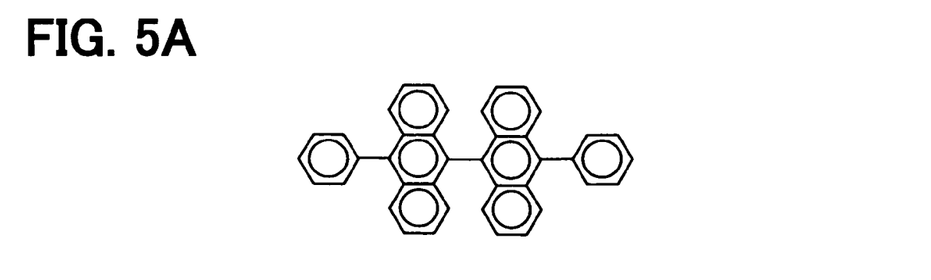
FIGS. 5A to 5D are schematic views showing chemical structures of compounds VA to VD, respectively.
Figure 5B:
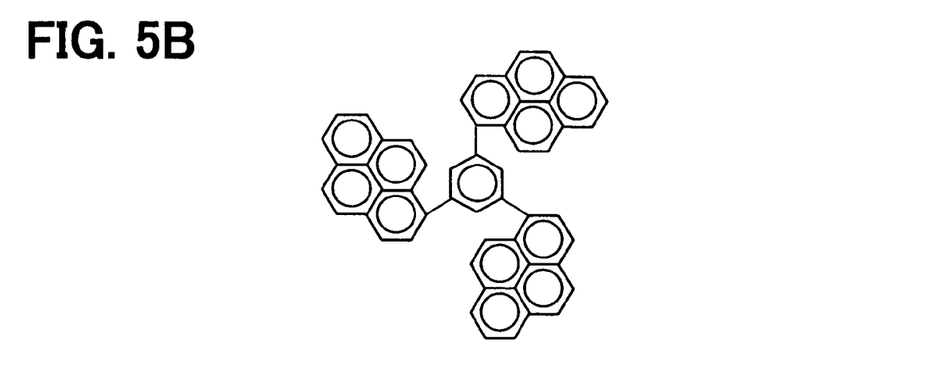
Figure 5C:
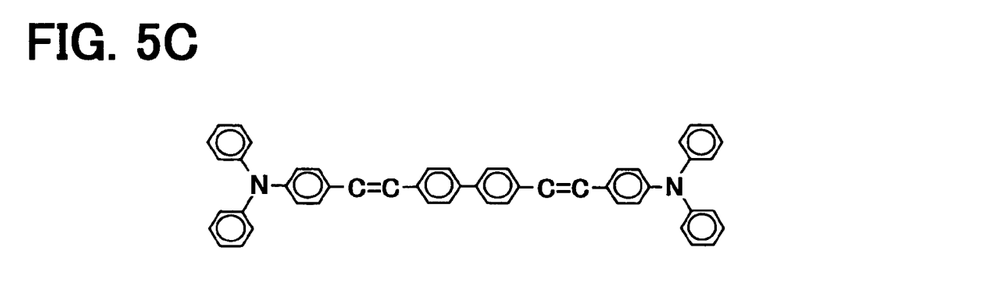
Figure 5D:
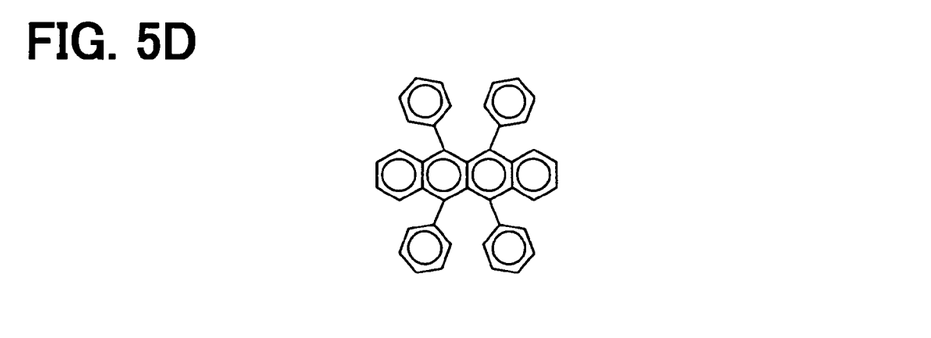

Thus, the organic EL device of the invention has an organic layer (90) having at least one layer (40, 50) containing Compound III shown in FIG. 3. According to the invention, the heat resistance and the vapor deposition property of the layer containing the tertiary amine compound of Compound III can be improved.

The emission duration can be further improved when the layer containing Compound III is a light emitting layer (50) prepared by mixing the hole transporting material of Compound III with an electron transporting material and a dopant light emitting material, and the ionization potential difference between the hole transporting material and the electron transporting material in the light emitting layer (50) is 0.35 eV or more.

The layer containing Compound III may be a hole transporting layer, a hole injecting layer, etc. other than the light emitting layer.

Figure 1:
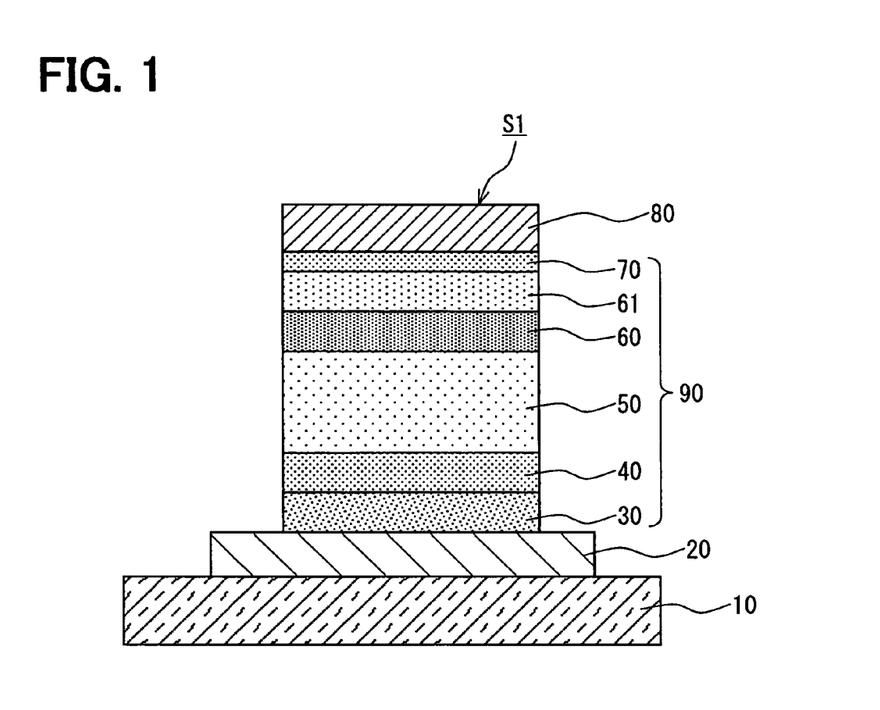
FIG. 1 is a cross sectional view showing an organic EL device.

An example embodiment will be described below with reference to drawings. FIG. 1 is a schematic view showing cross-sectional structure of an organic EL device S1 according to the embodiment of the invention.

In the organic EL device S1, an anode 20 of a transparent conducting layer composed of indium-tin oxide (hereinafter referred to as ITO), etc. is formed on a substrate 10 composed of a transparent glass, etc.

A hole injecting layer 30 is formed from a hole injecting material such as copper phthalocyanine (hereinafter referred to as CuPc), which is a crystallizable organic material, on the anode 20, and a hole transporting layer 40 is formed from a hole transporting material such as a tertiary amine compound on the hole injecting layer 30.

Further, a light emitting layer 50 is formed on the hole transporting layer 40 by mixing a host material containing an electron transporting material and a hole transporting material of a tertiary amine compound with a dopant light emitting material.

A first electron transporting layer 60 is formed on the light emitting layer 50 from a material equal to the electron transporting material in the light emitting layer 50, and a second electron transporting layer 61 of tris (8-quinolinolato) aluminum (hereinafter referred to as Alq3) is formed thereon.

Further, an electron injecting layer 70 of LiF (lithium fluoride), etc. is formed on the second electron transporting layer 61, and a cathode 80 of a metal such as Al (aluminum), etc. is formed thereon.

In the organic EL device S1 according to the embodiment, the hole transporting material used in the hole transporting layer 40 is the tertiary amine compound equal to the hole transporting material used in the light emitting layer 50. Specific examples of the materials used for the light emitting layer 50, such as the hole transporting materials, the electron transporting materials, and the dopant light emitting materials, will be hereinafter illustrated in chemical formulae.

Thus, the hole injecting layer 30, the hole transporting layer 40, the light emitting layer 50, the first and second electron transporting layers 60 and 61, and the electron injecting layer 70 are stacked and sandwiched between the pair of electrodes (the anode 20 and the cathode 80) to provide the organic EL device S1. The hole injecting layer 30, the hole transporting layer 40, the light emitting layer 50, and the first and second electron transporting layers 60 and 61 are organic layers 90 containing organic substances.

When an electric field is applied to the anode 20 and the cathode 80 in the organic EL device S1, holes are injected from the anode 20 and electrons are injected from the cathode 80. The holes and electrons are transported to and recombined in the light emitting layer 50, and the light emitting layer 50 emits a light due to thus generated energy. For example, the light is emitted from the substrate 10 and is visually observed.

The organic EL device S1 can be produced by forming the layers 20 to 80 respectively on the substrate 10 using a sputtering method, a vapor deposition method, etc. The organic layers 90 such as the hole injecting layer 30, the hole transporting layer 40, the light emitting layer 50, and the first and second electron transporting layers 60 and 61 can be formed by vapor deposition method.

The hole transporting material, the electron transporting material, and the dopant light emitting material used in the light emitting layer 50 will be described specifically below. The hole transporting material has only one oxidation potential obtained by a cyclic voltammetry method.

Figure 2:
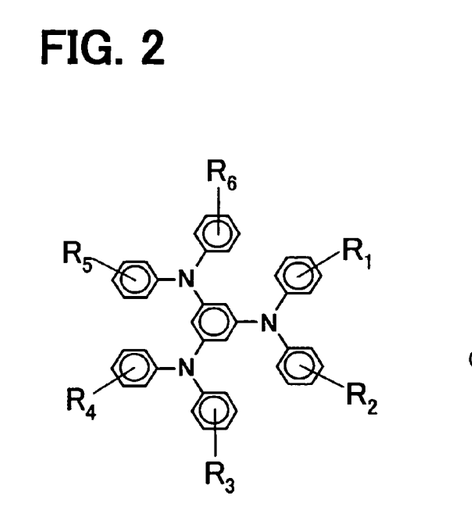
FIG. 2 is a schematic view showing a chemical structure of a starburst tertiary amine compound.

The tertiary amine compound used as the hole transporting material with one oxidation potential may be a starburst tertiary amine compound represented by the general chemical formula II of FIG. 2.

The starburst compound II of FIG. 2 is an unconjugated starburst compound, its center structure being not triphenylamine but benzene. In the general formula of FIG. 2, $R_1$ to $R_6$ are a hydrogen atom, an alkyl group, an aryl group, or an alkylaryl group, respectively.

The starburst compound is a tertiary amine compound that has only one oxidation potential measured by cyclic voltammetry method. It is considered that this is because nitrogen atoms are located at the meta positions in the center benzene ring, whereby the compound does not have a conjugated structure and is an unconjugated compound.

In this embodiment, Compound III shown in FIG. 3, which is a novel compound of the starburst compounds II of FIG. 2, is used as the hole transporting material in the light emitting layer 50.

Compound III is selected based on the results of experimental tests by the inventor. Examination Examples will be described below. The electron transporting material, the dopant light emitting material, etc. of the light emitting layer 50 according to this embodiment are not limited to these examples.

Component materials of the light emitting layer 50 used in Examination Examples are above mentioned Compound III shown in FIG. 3, and Compounds IVA, IVB, IVC, VA, VB, VC, and VD shown in FIGS. 4A, 4B, 4C, 5A, 5B, 5C, and 5D.

Compound IVA (FIG. 4A), Compound IVB (FIG. 4B), and Compound IVC (FIG. 4C) are comparative hole transporting materials, and Compounds IVA and IVC are starburst tertiary amine compounds described in US Patent Publication No. 2005-184657.

Compound VA (FIG. 5A) and Compound VB (FIG. 5B) are electron transporting materials, Compound VC (FIG. 5C) is a styrylamine derivative for blue light emission, Compound VD (FIG. 5D) is rubrene for yellow light emission, and thus Compounds VC and VD are dopant light emitting materials.

Only Compound III according to this embodiment and Compound IVB are unknown among Compounds III, IVA to IVC, and VA to VD, and thus synthesis methods of Compounds III and IVB will be described below.

Synthesis of Compound III, which is 1,3-bis[N,N-bis{(4'-methylbiphen-4-yl)}amino]-5-N,N-bis(4-methylphenyl)aminobenzene, is explained as follows.

9.1 grams (i.e., 0.02 mol) of 1,3,5-triiodobenzene, 15 grams of calcium hydride, 6.0 grams of copper powder, and 100 milliliters of mesitylene were added to a three-necked flask, and were heated to 180° C. under nitrogen. 3.5 grams (i.e., 0.018 mol) of bis(4-methylphenyl)amine was slowly added thereto dropwise and the components were reacted for 24 hours.

Then the obtained reaction mixture was added to ethanol and reprecipitated. The resultant precipitates were dissolved in toluene, the solution was subjected to a silica gel chromatography, and the fraction of the reaction product was isolated to obtain 1-N,N-bis(4-methylphenyl)amino-3,5-diiodobenzene (85% yield).

5.3 grams (i.e., 0.01 mol) of 1-N,N-bis(4-methylphenyl)amino-3,5-diiodobenzene, 10.5 grams (i.e., 0.03 mol) of bis{(4'-methylbiphen-4-yl)}amine, 15 grams of calcium hydride, 6.0 grams of copper powder, and 100 milliliters of mesitylene were added to a three-necked flask and reacted under nitrogen at 180° C. for 24 hours.

Then the obtained reaction mixture was added to ethanol and reprecipitated. The resultant precipitates were dissolved in toluene, the solution was subjected to a silica gel chromatography, and the fraction of the reaction product was isolated.

The reaction product was purified by recrystallization from a toluene-ethanol mixed solvent twice, to obtain Compound III of 1,3-bis[N,N-bis{(4'-methylbiphen-4-yl)}amino]-5-N,N-bis(4-methylphenyl)aminobenzene. In this case, the yield is 70%.

Synthesis of Compound IVB, which is 1,3,5-tris[N,N-bis{(3'-methylbiphen-4-yl)}amino]benzene, is explained as follows.

17.5 grams (i.e., 0.05 mol) of bis{(3'-methylbiphen-4-yl)}amine, 4.6 grams (i.e., 0.01 mol) of 1,3,5-triiodobenzene, 7.5 grams of calcium hydride, 3.0 grams of copper powder, and 30 milliliters of mesitylene were added to a three-necked flask and reacted under nitrogen at 180° C. for 24 hours.

Then the obtained reaction mixture was added to ethanol and reprecipitated. The resultant precipitates were dissolved in toluene, the solution was subjected to a silica gel chromatography, and the fraction of the reaction product was isolated.

The reaction product was purified by recrystallization from a toluene-ethanol mixed solvent twice, to obtain Compound IVB of 1,3,5-tris[N,N-bis{(3'-methylbiphen-4-yl)}amino]benzene. In this case, the yield is 70%.

Physical properties of compounds used in Examination Examples, i.e., characteristic values of Compounds III, IVA to IVC, and VA to VD, the above described compounds other than the dopant light emitting materials of Compound VC and VD, are described below.

The glass transition temperature (i.e., Tg) of Compound III according to this embodiment was 180° C., and that of Comparative Compound IVA was 103° C. The glass transition temperatures of Compounds IVB and IVC were not observed, and thus the compounds did not have the glass transition temperature Tg. Further, the glass transition temperatures of the electron transporting materials of Compounds VA and VB were 175° C., 164° C., respectively.

Materials having glass transition temperatures, such as Compounds III and IVA, generally have crystallization temperatures and melting points (i.e., Tm) higher than the glass transition temperatures. As a result of measuring the temperatures, the crystallization temperature of Compound III could not be observed, while Compound III had a melting point of 325° C. The crystallization temperature and the melting point of Compound IVA were 139° C. and 278° C., respectively. In comparison therewith, Compounds IVB and IVC had only the melting points, 325° C. and 408° C., respectively.

It is considered that Compounds IVB and IVC have only the melting points because they are remarkably highly symmetric molecules and thus show small intermolecular distances, to have remarkably high intermolecular interaction forces. Thus, it is clear that Compounds IVB and IVC have extremely high heat stability, the molecules thereof being stable at a temperature lower than the melting points.

The ionization potentials (i.e., Ip) of Compounds III, IVA to IVC, and VA to VB are 5.42 eV, 5.50 eV, 5.53 eV, 5.47 eV, 5.85 eV, and 5.75 eV, respectively. The ionization potentials were measured by a photoelectron spectrometer AC-2 manufactured by Riken Keiki Co., Ltd.

The oxidation potentials of Compounds III and IVA to IVC used as the hole transporting materials were measured by a commonly known cyclic voltammetry method, i.e., by changing electrical potential of a solution containing the tertiary amine compound used as the hole transporting material in the light emitting layer 50. As a result of the measurement, all of Compounds III and IVA to IVC have only one oxidation potential.

It should be noted that the conditions of the cyclic voltammetry method are as follows. A reference electrode is a saturated calomel electrode, a work electrode is a platinum electrode, a counter electrode is a platinum electrode, a supporting electrolyte is a tetra-n-butylammonium chlorate, a measurement sample is a methylene chloride solution containing 1 milli-mol/L of measuring object compound and 0.1 milli-mol/L of supporting electrolyte, and measurement conditions are room temperature with a sweep rate of 100 mV/sec (triangular wave). Results of vapor deposition property evaluation are explained as follows.

Then the vapor deposition properties of the hole transporting material Compounds III and IVA to IVC were evaluated. As described above, hole transporting materials can be formed into films in organic EL devices by common vapor deposition. Thus, single layers of Compounds III and IVA to IVC were formed by vapor deposition respectively, to evaluate those vapor deposition properties.

The vapor deposition property was evaluated by examining the vapor deposition speed and the decomposition of the material. The vapor deposition speed can be measured by a vapor deposition apparatus, and the decomposition of the material can be measured by equipping the vapor deposition apparatus with a mass spectrometer. The term material temperature means the heating temperature of the material in the vapor deposition.

Figure 6:
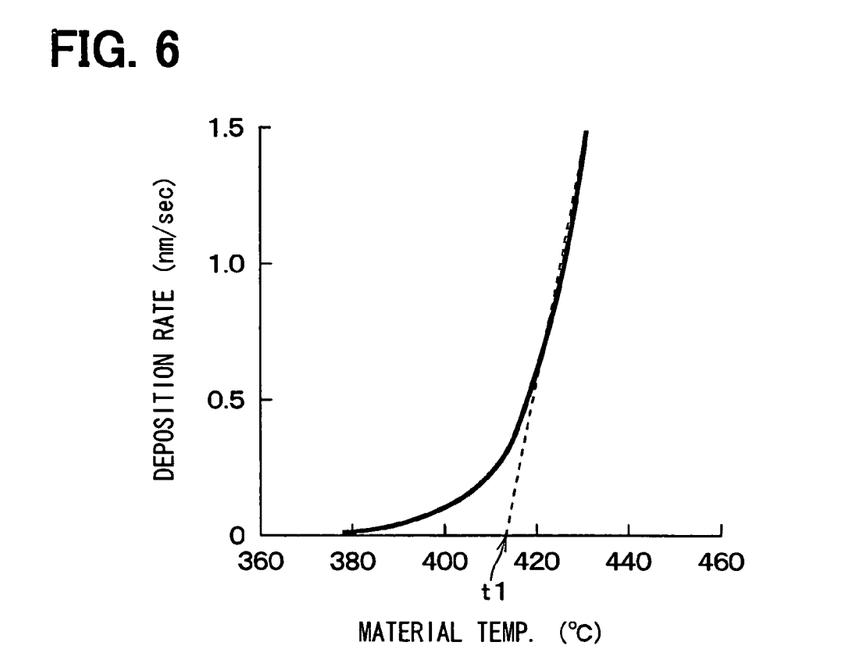
FIG. 6 is a graph showing deposition rate and material temperature in the compound IVC.
Figure 7:
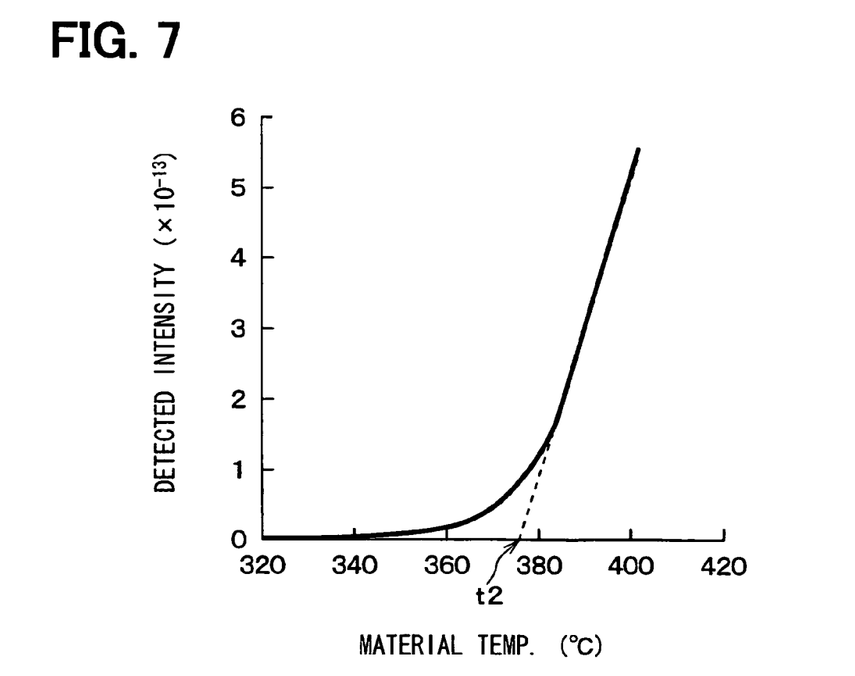
FIG. 7 is a graph showing detection intensity of decomposition product and material temperature in the compound IVC.

The measurement results of Compound IVC (in FIG. 4C) are shown in FIGS. 6 and 7 as an example. FIG. 6 is a graph showing the relation between the material temperature and the vapor deposition speed, and FIG. 7 is a graph showing the relation between the material temperature and the detected intensity of the decomposition product (i.e., the decomposition product amount).

As shown in FIGS. 6 and 7, the vapor deposition speed and the decomposition product amount nonlinearly increase rapidly with the material temperature rise. The terms "a vapor deposition speed threshold temperature t1" and "a decomposition threshold temperature t2" are defined as temperatures obtained from the extrapolation values of the relation curves shown in FIGS. 6 and 7, respectively.

To obtain a stable, sufficient vapor deposition speed, the vapor deposition speed threshold temperature t1 has to be lower than the decomposition threshold temperature t2. Thus, when the t1 is higher than t2, the compound is decomposed in the vapor deposition process and it is difficult to obtain a stable layer.

As shown in FIGS. 6 and 7, Compound IVC has a vapor deposition speed threshold temperature t1 of 415° C. and a decomposition threshold temperature t2 of 375° C., whereby Compound IVC unlikely to achieve a stable, sufficient vapor deposition speed.

Figure 8:
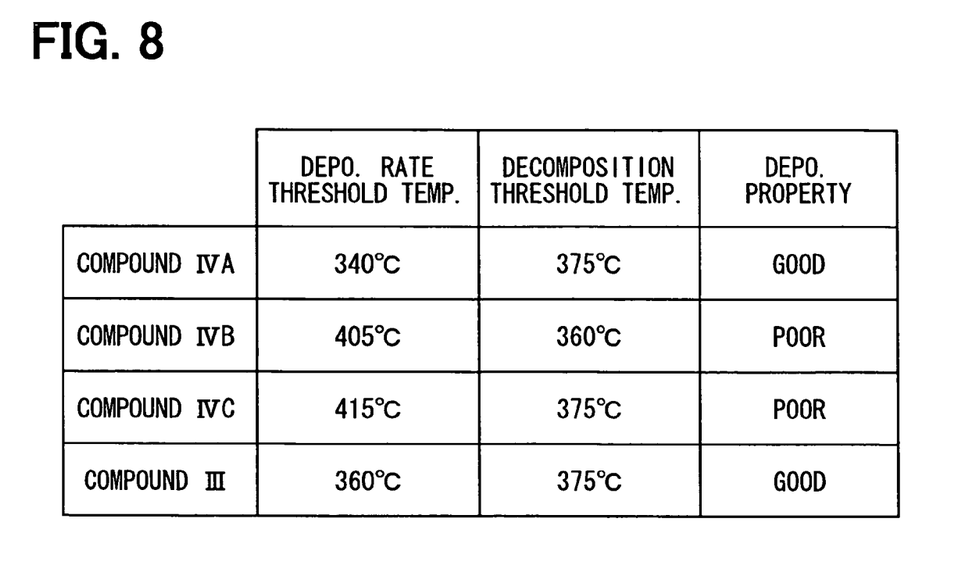
FIG. 8 is a table showing deposition properties in various compounds.

The vapor deposition speed threshold temperatures t1, decomposition threshold temperatures t2, and vapor deposition properties of Compound III and IVA to IVC were measured in the same manner. The results of the measurement are shown in FIG. 8. In FIG. 8, the term "Good" means that t1 is lower than t2 and the vapor deposition property is sufficient, and the term "Poor" means that t1 is higher than t2 and the vapor deposition property is insufficient.

As is clear from FIG. 8, Compound III according to the embodiment and Comparative Compound IVA have sufficient vapor deposition properties, and Comparative Compounds IVB and IVC have insufficient vapor deposition properties while they are remarkably high in thermal stability.

It is presumed that Comparative Compounds IVB and IVC have the insufficient vapor deposition properties because Compound IVC is highly symmetric to have a high melting point and Compound IVB has intramolecular steric hindrance to reduce the decomposition temperature.

Though the vapor deposition temperature can be made equal to or lower than the decomposition temperature theoretically by reducing film forming rate, a certain level of film forming rate is necessary for achieve a sufficient productivity and the reduction of the film forming rate is disadvantageous in production costs.

Compounds III and IVA are both excellent in the vapor deposition property, Compound III according to this embodiment has Tg of 180° C., and Comparative Compound IVA has Tg of 103° C., as described above. The heat resistance of a layer depends on Tg, whereby Compound III (in FIG. 3) is used in this embodiment as the hole transporting material in the light emitting layer 50 to achieve improvement of both the heat resistance and vapor deposition property.

The inventor considers that Compound III according to this embodiment can show the glass transition temperature and vapor deposition property higher than those of Comparative Compound IVA described in US Patent Publication No. 2005-184657 because of the following reason.

Applying Comparative Compound IVA (in FIG. 4A) to the starburst tertiary amine compound represented by the general formula of FIG. 2, $R_1$ and $R_2$, $R_3$ and $R_4$, and $R_5$ and $R_6$ of Compound IVA are different groups respectively. Specifically $R_1$, $R_3$, and $R_5$ are methylbiphenyl groups, and $R_2$, $R_4$, and $R_6$ are methylphenyl groups. Thus, Compound IVA has such a structure that each nitrogen atom has different end groups.

In comparison with this, as shown in FIG. 3, Compound III according to this embodiment has such an asymmetric structure that each nitrogen atom has the same end groups and the adjacent nitrogen atoms have different end groups. Specifically, in the general formula of FIG. 2, $R_1$, $R_2$, $R_3$, and $R_4$ are methylbiphenyl groups and $R_5$ and $R_6$ are methylphenyl groups.

Thus, Compound III according to this embodiment is intramolecularly high-symmetric because of the nitrogen atoms with the same end groups and the biphenyl groups. However, the entire molecular of Compound III is asymmetric such that the adjacent nitrogen atoms have different end groups.

Therefore, Compound III according to this embodiment has the high glass transition temperature due to partial high symmetry property, and further has the relatively low melting point and the high vapor deposition property due to the asymmetry property of the entire molecular.

Results of emission duration evaluation are explained as follows organic EL devices S1 were produced using Compounds III, IVA to IVC and VA to VD and their emission durations were evaluated. The results are shown in FIG. 9.

Figure 9:
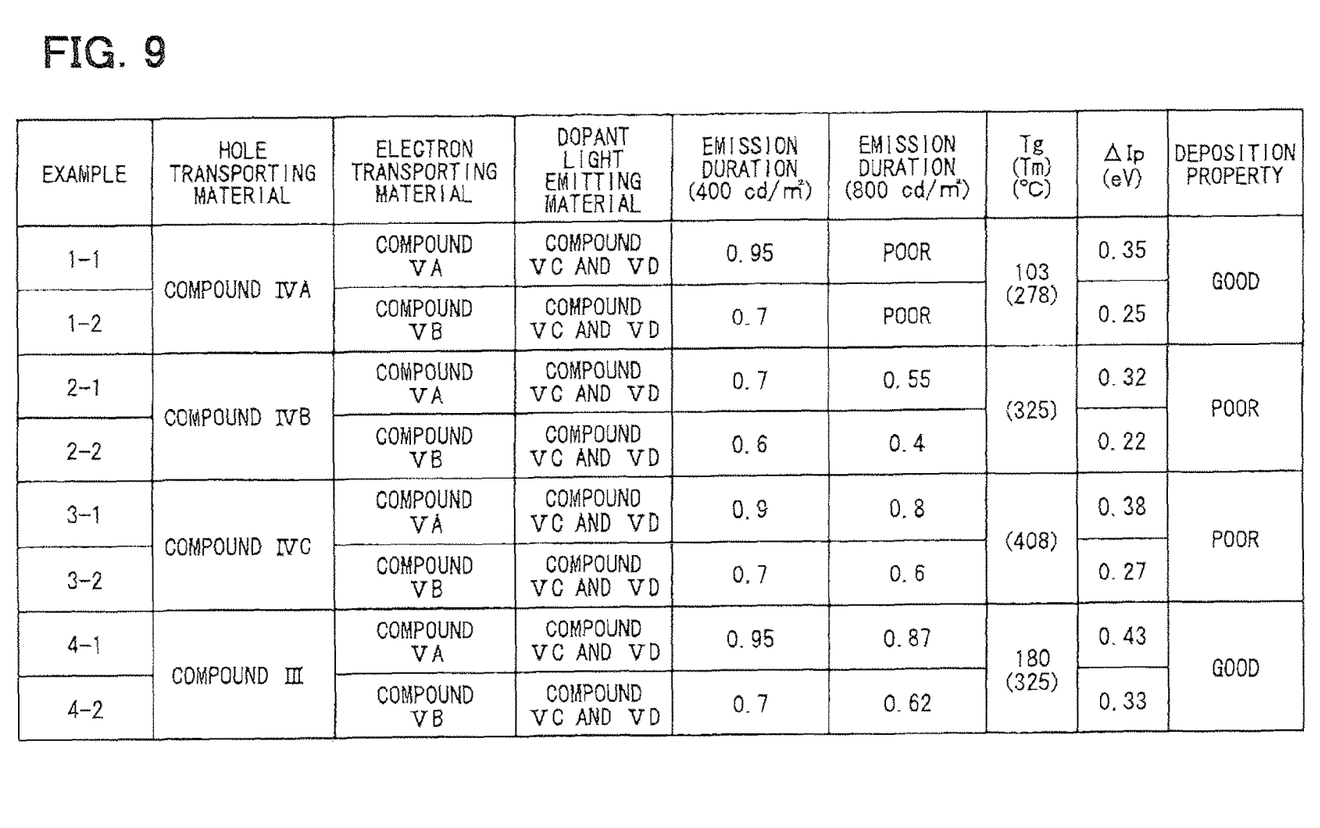
FIG. 9 is a table showing emission duration in various samples.

Shown in the table of FIG. 9 for each of Examination Examples are the following items: the hole transporting material, the electron transporting material, and the dopant light emitting material used in the light emitting layer 50; the emission duration; Tg and Tm (melting point) of the hole transporting material; and the ionization potential difference ΔIp (eV) between the hole transporting material and the electron transporting material.

The emission duration is represented by a relative luminance, which is obtained such that the organic EL device produced in each Examination Example is subjected to an endurance test under conditions of a temperature of 85° C., an initial luminance of 400 cd/m² and 800 cd/m², and 1/64 duty drive, the luminance is measured at a driving time of 400 hours, and the measured luminance is converted by using the initial luminance as the standard value of 1.

In a case where a dark spot is formed or short circuit is caused in the organic EL device in the endurance test, the emission duration is evaluated as Poor. Further, the item of the vapor deposition property corresponding to each hole transporting material shown in FIG. 8 is shown also in FIG. 9. Each of Examination Examples shown in FIG. 9 will be specifically described in detail below.

In Examination Examples, to precisely measure the emission duration in the production of the organic EL device, vapor deposition steps were carried out at a temperature equal to or lower than the decomposition temperature, though the condition was extremely disadvantageous in productivity.

Examination Example 1-1

An ITO film was formed as an anode 20 on a glass substrate 10, and was surface-polished such that Ra was about 1 nm and Rz was about 10 nm. A 10 nm-thick hole injecting layer 30 of CuPc was formed on the anode 20, and a 20 nm-thick hole transporting layer 40 of a tertiary amine compound of Comparative Compound IVA (in FIG. 4A) was formed on the hole injecting layer 30.

A 20 nm-thick light emitting layer 50 was formed thereon using Compound IVA, an electron transporting material of Compound VA (in FIG. 5A), and a dopant light emitting material of Compound VD (in FIG. 5D) at a weight ratio of 60:20:3. Further, a 20 nm-thick layer was formed thereon using Compound IVA, Compound VA, and a dopant light emitting material of Compound VC (in FIG. 5C) at a weight ratio of 60:15:3.

Then, a 20 nm-thick first electron transporting layer 60 of Compound VA, a 10 nm-thick second electron transporting layer 61 of Alq3, an electron injecting layer 70 of LiF, and a cathode 80 of Al were formed thereon in this order, and the resultant was tightly sealed by a sealing can under dry nitrogen to obtain an organic EL device. The device emitted a white light due to the blue light emission of Compound VC and the yellow light emission of Compound VD.

Examination Example 1-2

An organic EL device was produced in the same manner as Examination Example 1-1 except for using Compound VB (in FIG. 5B) as the electron transporting material in the light emitting layer 50 and the first electron transporting layer 60.

Examination Example 2-1

An organic EL device was produced in the same manner as Examination Example 1-1 except for using Comparative Compound IVB (in FIG. 4B) as the tertiary amine compound in the hole transporting layer 40 and the light emitting layer 50.

Examination Example 2-2

An organic EL device was produced in the same manner as Examination Example 2-1 except for using Compound VB as the electron transporting material in the light emitting layer 50 and the first electron transporting layer 60.

Examination Example 3-1

An organic EL device was produced in the same manner as Examination Example 1-1 except for using Comparative Compound IVC (in FIG. 4C) as the tertiary amine compound in the hole transporting layer 40 and the light emitting layer 50.

Examination Example 3-2

An organic EL device was produced in the same manner as Examination Example 3-1 except for using Compound VB as the electron transporting material in the light emitting layer 50 and the first electron transporting layer 60.

Examination Example 4-1

An organic EL device was produced in the same manner as Examination Example 1-1 except for using Compound III (in FIG. 3) according to this embodiment as the tertiary amine compound in the hole transporting layer 40 and the light emitting layer 50.

Examination Example 4-2

An organic EL device was produced in the same manner as Examination Example 4-1 except for using Compound VB as the electron transporting material in the light emitting layer 50 and the first electron transporting layer 60.

Then features of each Examination Example are described based on the results shown in FIG. 9. The devices of Examination Examples 1-1 to 4-2 were subjected to the endurance test under conditions of 85° C., initial luminance of 400 cd/m² and 800 cd/m², and 1/64 duty drive respectively, and the results are shown in FIG. 9.

In Examination Examples 1-1 to 4-2, dark spot and short circuit were not observed in the test under the initial luminance of 400 cd/m². Particularly in Examination Examples 1-1, 3-1, and 4-1, the ionization potential differences ΔIp between the hole transporting materials and the electron transporting materials were 0.35 eV or more while the emission durations were 0.9 or more at practical level.

It is believed based on the emission mechanism of the organic EL devices that, as the ionization potential difference ΔIp is reduced, charge transfer is caused between the hole transporting material and the electron transporting material in the host of the light emitting layer, and the electron transporting material is excited, to reduce the emission duration, more easily. This seems true despite the types of the hole transporting material and the electron transporting material.

Therefore, in the light emitting layer 50 of the mixture of the electron transporting material and the dopant light emitting material according to this embodiment, it is expected that the emission duration can be greatly improved by controlling the ionization potential difference between the hole transporting material and the electron transporting material in the light emitting layer 50 to 0.35 eV or more.

Further, in the test under the higher initial luminance of 800 cd/m², in Examination Examples 1-1 and 1-2, dark spot formation and short circuit were caused and the devices could not be evaluated. This suggests that, in the case of such high luminance emission, the inner temperature of the device could be higher than the glass transition temperature 103° C. of Compound IVA though the test was carried out at 85° C. Incidentally in Examination Examples 1-1 and 1-2, the glass surface temperature was approximately 90° C. in the test.

The vapor deposition properties of Examination Examples 2-1, 2-2, 3-1, and 3-2 are Poor. The results are referable to the insufficient vapor deposition properties of Compounds IVB and IVC as shown in FIG. 8.

As described above, in this embodiment, the heat resistance and the vapor deposition property of the light emitting layer 50 can be improved by using novel Compound III with the improved heat resistance and vapor deposition property as a starburst tertiary amine compound in the host of the light emitting layer 50.

Though Compound III is contained in both of the light emitting layer 50 and the hole transporting layer 40 in the above embodiment, Compound III may be contained in only the light emitting layer, the hole transporting layer, or the hole injecting layer. Thus, the organic EL device may have various structures as long as the organic layer thereof contains at least one layer containing Compound III.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. An organic EL device comprising:
a pair of electrodes; and
an organic layer sandwiched between the pair of electrodes, wherein
the organic layer includes at least one compound including layer, and the compound including layer includes a compound of:

the compound including layer is a light emitting layer, which is made of mixture of a hole transporting material, an electron transporting material and a light emitting additive,
the compound is the hole transporting material,
the hole transporting material has a glass transition temperature equal to or larger than 180° C.,
the compound has a decomposition threshold temperature, which is higher than a deposition rate threshold temperature of the compound,
the hole transporting material in the light emitting layer has a first ionization potential, and the electron transporting material in the light emitting layer has a second ionization potential, and
a difference between the first and second ionization potentials is equal to or larger than 0.35 eV,
wherein the first ionization potential of the compound is 5.42 eV.
2. The device according to claim 1 wherein
the electron transporting material is made of a compound of:

and the light emitting additive is made of a compound of:

or

3. The device according to claim 1, wherein the compound including layer is a hole transporting layer, which includes the compound.

4. The device according to claim 1, wherein the compound including layer is a hole injecting layer, which includes the compound.

5. The device according to claim 1, wherein the organic layer includes a hole injection layer, a hole transporting layer, a light emitting layer, an electron transporting layer, and an electron injecting layer, which are stacked in this order, and
one of the pair of electrodes contacts the hole injecting layer, and provides an anode, and
the other one of the pair of electrodes contacts the electron injecting layer, and provides a cathode.

* * * * *